(12) United States Patent
Huang et al.

(10) Patent No.: US 11,024,643 B2
(45) Date of Patent: *Jun. 1, 2021

(54) METHODS OF FORMING INTEGRATED STRUCTURES COMPRISING VERTICAL CHANNEL MATERIAL AND HAVING CONDUCTIVELY-DOPED SEMICONDUCTOR MATERIAL DIRECTLY AGAINST LOWER SIDEWALLS OF THE CHANNEL MATERIAL

(71) Applicant: Micron Technology, Inc., Boise, ID (US)

(72) Inventors: Guangyu Huang, Boise, ID (US); Haitao Liu, Boise, ID (US); Chandra Mouli, Boise, ID (US); Justin B. Dorhout, Boise, ID (US); Sanh D. Tang, Kuna, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/541,029

(22) Filed: Aug. 14, 2019

(65) Prior Publication Data

US 2019/0371816 A1 Dec. 5, 2019

Related U.S. Application Data

(60) Division of application No. 15/945,215, filed on Apr. 4, 2018, now Pat. No. 10,418,379, which is a
(Continued)

(51) Int. Cl.
*H01L 27/11582* (2017.01)
*H01L 23/522* (2006.01)
(Continued)

(52) U.S. Cl.
CPC .... *H01L 27/11582* (2013.01); *H01L 23/5226* (2013.01); *H01L 27/1157* (2013.01); *H01L 28/00* (2013.01)

(58) Field of Classification Search
CPC ......... H01L 27/11582; H01L 27/11556; H01L 27/11524; H01L 27/1157; H01L 29/66833;
(Continued)

(56) References Cited

U.S. PATENT DOCUMENTS 8,163,617 B2   4/2012  Ahn
8,395,941 B2 *  3/2013  Fishburn ............ G11C 16/0408
                                                    365/185.17

(Continued)

OTHER PUBLICATIONS

Skotnicki et al., "Well-Controlled, Selectively Under-Etched Si/SiGe Gates for RF and High Performance CMOS", IEEE Symposium on VLSI Technology Digest of Technical Papers, 2000, United States, pp. 156-157.
(Continued)

*Primary Examiner* — Khiem D Nguyen
(74) *Attorney, Agent, or Firm* — Wells St. John P.S.

(57) ABSTRACT

Some embodiments include an integrated structure having vertically-stacked conductive levels. Upper conductive levels are memory cell levels, and a lower conductive level is a select device level. Conductively-doped semiconductor material is under the select device level. Channel material extends along the memory cell levels and the select device level, and extends into the conductively-doped semiconductor material. A region of the channel material that extends into the conductively-doped semiconductor material is a lower region of the channel material and has a vertical sidewall. Tunneling material, charge-storage material and charge-blocking material extend along the channel material and are between the channel material and the conductive
(Continued)

levels. The tunneling material, charge-storage material and charge-blocking material are not along at least a portion of the vertical sidewall of the lower region of the channel material, and the conductively-doped semiconductor material is directly against such portion. Some embodiments include methods of forming integrated structures.

17 Claims, 10 Drawing Sheets

Related U.S. Application Data continuation of application No. 15/651,916, filed on Jul. 17, 2017, now Pat. No. 9,941,298, which is a division of application No. 15/130,803, filed on Apr. 15, 2016, now Pat. No. 9,741,737.

(51) Int. Cl.
*H01L 27/1157* (2017.01)
*H01L 49/02* (2006.01)

(58) Field of Classification Search
CPC ......... H01L 29/40117; H01L 27/11578; H01L 29/40114; H01L 27/10844; H01L 27/11529; H01L 27/11553; H01L 27/11575; H01L 27/1158; H01L 37/2454; H01L 27/2481
See application file for complete search history.

(56) References Cited

U.S. PATENT DOCUMENTS

| | | | |
|---|---|---|---|
| 9,147,681 B2 | 9/2015 | Liu | |
| 9,224,752 B1* | 12/2015 | Lee | H01L 29/66833 |
| 9,431,419 B2 | 8/2016 | Fukuzumi et al. | |
| 9,627,405 B1* | 4/2017 | Lee | H01L 27/1158 |
| 9,741,737 B1 | 8/2017 | Huang et al. | |
| 9,780,112 B2* | 10/2017 | Liu | H01L 27/11556 |
| 9,941,298 B2* | 4/2018 | Huang | H01L 27/11582 |
| 2010/0163968 A1* | 7/2010 | Kim | H01L 27/11565 |
| | | | 257/324 |
| 2012/0091521 A1 | 4/2012 | Goda | |
| 2012/0329224 A1* | 12/2012 | Kong | H01L 21/0332 |
| | | | 438/268 |
| 2013/0001682 A1* | 1/2013 | Tang | H01L 21/02532 |
| | | | 257/331 |
| 2013/0069118 A1* | 3/2013 | Mori | H01L 29/66833 |
| | | | 257/202 |
| 2013/0095646 A1 | 4/2013 | Alsmeier et al. | |
| 2013/0134492 A1* | 5/2013 | Yang | H01L 27/1157 |
| | | | 257/314 |
| 2014/0042520 A1 | 2/2014 | Lee et al. | |
| 2014/0097486 A1* | 4/2014 | Ramaswamy | H01L 27/1157 |
| | | | 257/326 |
| 2014/0126290 A1 | 5/2014 | Sakui et al. | |
| 2014/0252452 A1 | 9/2014 | Alsmeier | |
| 2014/0264533 A1 | 9/2014 | Simsek-Ege | |
| 2015/0140753 A1* | 5/2015 | Simsek-Ege | H01L 21/32139 |
| | | | 438/268 |
| 2015/0145020 A1* | 5/2015 | Kim | H01L 29/7889 |
| | | | 257/324 |
| 2015/0357345 A1 | 12/2015 | Lee et al. | |
| 2015/0372005 A1 | 12/2015 | Yon et al. | |
| 2015/0380428 A1* | 12/2015 | Matsuda | H01L 27/11565 |
| | | | 257/314 |
| 2016/0118396 A1 | 4/2016 | Rabkin et al. | |
| 2016/0225714 A1 | 8/2016 | Yun | |
| 2016/0240552 A1* | 8/2016 | Arai | H01L 27/11582 |
| 2016/0284719 A1* | 9/2016 | Zhu | H01L 27/1157 |
| 2016/0293621 A1 | 10/2016 | Huang | |
| 2016/0315095 A1 | 10/2016 | Sel et al. | |
| 2016/0379989 A1 | 12/2016 | Sharangpani et al. | |
| 2017/0077131 A1* | 3/2017 | Konagai | H01L 27/11565 |

OTHER PUBLICATIONS

Snow et al., "Selective Etching of SiGe for Removal of Dummy Layers in Fully Silicided Gate Architectures", 208th ECS Meeting, Abstract #778, Oct. 8, 2005. Retrieved Mar. 2, 2016 from http://ma.ecsdl.org/content/MA2005-02/20/778.abstract?sid=437cff79-b679-4cd7-88e4-99343d4e4e1e, 1 page.

Katsumata et al, "Pipe-Shaped BICS Flash Memory with 16 Stacked Layers and Multi-Level-Cell Operation for Ultra High Desnity Storage Devices", IEEE Symposium on VLSI Technology Digest of Papers, 2009, United States, pp. 136-137.

\* cited by examiner

METHODS OF FORMING INTEGRATED STRUCTURES COMPRISING VERTICAL CHANNEL MATERIAL AND HAVING CONDUCTIVELY-DOPED SEMICONDUCTOR MATERIAL DIRECTLY AGAINST LOWER SIDEWALLS OF THE CHANNEL MATERIAL

RELATED PATENT DATA

This patent resulted from a divisional of U.S. patent application Ser. No. 15/945,215 filed Apr. 4, 2018, now U.S. Pat. No. 10,418,379, which resulted from a continuation of U.S. patent application Ser. No. 15/651,916, which was filed Jul. 17, 2017, now U.S. Pat. No. 9,941,298, which resulted from a divisional of U.S. patent application Ser. No. 15/130,803, which was filed Apr. 15, 2016, which issued as U.S. Pat. No. 9,741,737, each of which is hereby incorporated herein by reference.

TECHNICAL FIELD

Integrated structures comprising vertical channel material and having conductively-doped semiconductor material directly against lower sidewalls of the channel material, and methods of forming integrated structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells.

The vertically-stacked memory cells may be block-erased by generating hole carriers beneath them, and then utilizing an electric field to sweep the hole carriers upwardly along the memory cells.

A gating structure of a transistor may be utilized to provide gate-induced drain leakage (GIDL) which generates the holes utilized for block-erase of the memory cells. The transistor may be a select device, such as a source-side select (SGS) device. A channel material may extend along a string of memory cells and be gatedly coupled with the SGS device. The gatedly coupled portion of the channel is a portion that overlaps a gate of SGS device. It can be desired that such portion include both a heavily-doped lower region and a lightly-doped upper region; with both regions overlapping the gate of the SGS device. Specifically, overlap with the lightly-doped region provides a non-leaky "OFF" characteristic for the SGS device, and overlap with the heavily-doped region provides leaky GIDL characteristics for the SGS device. The terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some applications, the term "lightly-doped" refers to semiconductor material having less than or equal to about $10^{18}$ atoms/cm$^3$ of dopant, and the term "heavily-doped" refers to semiconductor material having greater than or equal to about $10^{19}$ atoms/cm$^3$ of dopant.

A select device may comprise any of numerous configurations, including, for example, a single MOSFET transistor, a one-wordline memory cell, a multi-wordline memory cell, etc.

The channel material may be initially doped to the lightly-doped level, and then the heavily-doped region may be formed by out-diffusion from an underlying doped semiconductor material. However, difficulties are encountered in utilizing the out-diffusion to obtain desired doping to a desired location within the gated region of the SGS device. Accordingly, it would be desirable to develop new integrated structures more suitable for achieving desired doping within the gated region of the SGS device, and to develop methods of forming such integrated structures.

DETAILED DESCRIPTION OF THE ILLUSTRATED EMBODIMENTS

Some embodiments include new integrated structures having vertically-stacked memory levels over a select device level (e.g., an SGS device level), and having conductively-doped semiconductor material under the select device level. Channel material extends vertically along the memory cell levels and the select device level. Tunneling material, charge-storage material and charge-blocking material extend vertically along the channel material and are between the channel material and the vertically-stacked memory levels. The tunneling material, charge-storage material and charge-blocking material are not along a lower region of the channel material, and the conductively-doped semiconductor material is directly against such lower region. Dopant may be out-diffused from the conductively-doped semiconductor material into the lower region of the channel material, and upwardly from the lower region to a gated region adjacent the select device level. The out-diffused dopant may be uniformly provided at desired locations across an array so that the various select devices across the array have desired non-leaky "OFF" characteristics and yet are appropriately configured to generate GIDL-induced holes for block erase of memory cells. Example embodiments are described below with reference to FIGS. 1-11.

Figure 1:
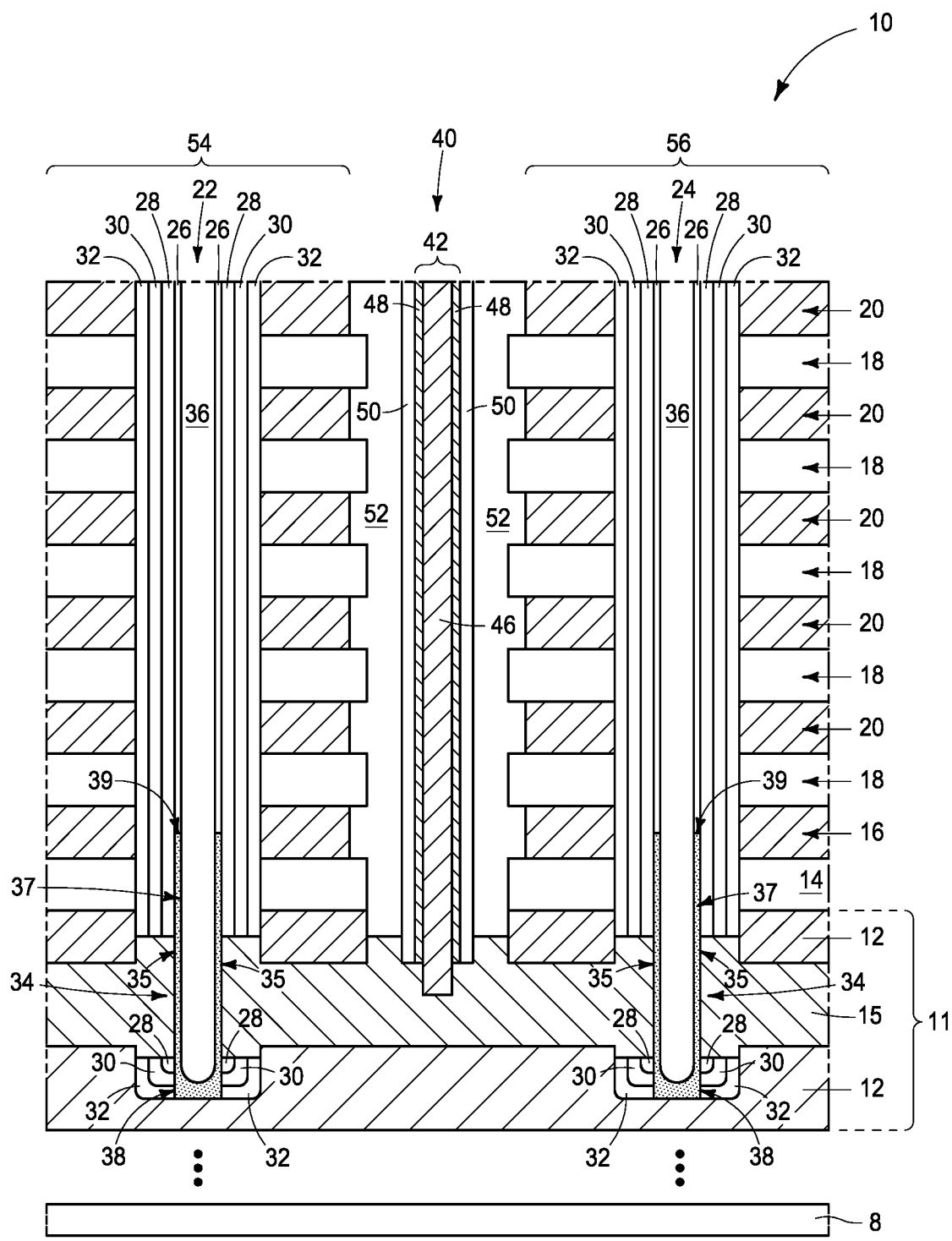
FIG. 1 is a diagrammatic cross-sectional view of an example embodiment integrated structure.

Referring to FIG. 1, an example embodiment semiconductor construction (i.e., integrated structure) 10 is shown to comprise a stack of alternating first and second levels 18 and 20. The levels 18 are dielectric, and the levels 20 are conductive.

The conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 20 may comprise n-type doped polycrystalline silicon (i.e., n-type doped polysilicon) of SONOS (semiconductor-oxide-nitride-oxide-semiconductor), or metal of MONOS (metal-oxide-nitride-oxide-semiconductor); with an example MONOS being TANOS (tantalum-alumina-nitride-oxide-semiconductor).

The conductive levels 20 may correspond to wordlines, and may comprise control gates for memory cells (described below). In some embodiments the conductive levels may be referred to as memory cell levels of a NAND configuration. The NAND configuration includes a string of memory cells (a so-called NAND string), with the number of memory cells in the string being determined by the number of memory cell levels 20. The NAND string may comprise any suitable number of memory cell levels. For instance, the NAND string may have 8 memory cell levels, 16 memory cell levels, 32 memory cell levels, 64 memory cell levels, 512 memory cell levels, 1024 memory cell levels, etc.

The dielectric levels 18 may comprise any suitable composition or combination of compositions; and may, for example, comprise oxide (e.g., silicon dioxide). In some embodiments the dielectric levels 18 and may be referred to as intervening levels provided as spacing between conductive levels 20.

The levels 18 and 20 may be of any suitable thicknesses. The levels 18 may be of different thickness than the levels 20, or may be the same thickness as the levels 20.

The stack is over a select device level 16. The select device level 16 may comprise any suitable electrically conductive composition or combination of compositions; and may, for example, comprise conductively-doped semiconductor material, metal and/or metal-containing compositions. In some embodiments the select device level 16 is a same composition as the conductive levels 20.

In some embodiments levels 16 and 18 may be referred to as vertically-stacked conductive levels; with upper levels 18 being memory cell levels and lower level 16 being a select device level. Although one select device level is shown, in other embodiments there may be more than one select device level.

The select device level is over an insulative material 14. Material 14 may comprise, for example, one or more oxides; such as, for example, one or more of silicon dioxide, aluminum oxide, hafnium oxide, etc.

Insulative material 14 is over an upper region of a first conductively-doped semiconductor material 12, which is over a second conductively-doped semiconductor material 15, which in turn is over a lower region of the first conductively-doped semiconductor material 12.

The first and second conductively-doped semiconductor materials 12 and 15 may be the same composition as one another in some embodiments (and accordingly may effectively merge into a single homogeneous semiconductor material), and may be compositionally different from one another in other embodiments. In some embodiments conductively-doped semiconductor materials 12 and 15 may both comprise conductively-doped silicon. In some embodiments one of the conductively-doped semiconductor materials 12 and 15 may consist essentially of, or consist of conductively-doped silicon, and the other may comprise germanium.

The conductively-doped semiconductor materials 12 and 15 may be part of a source line 11. Such source line may also comprise a metal-containing material (not shown) under the lower region of conductively-doped semiconductor material 12.

The source line 11 may be supported by a semiconductor substrate 8. Such substrate may comprise any suitable semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the semiconductor substrate 8 may contain one or more materials associated with integrated circuit fabrication. Such materials may include, for example, one or more of refractory metal materials, barrier materials, diffusion materials, insulator materials, etc.

Openings 22 and 24 extend through the levels 18 and 20, and downwardly into the lower region of conductively-doped semiconductor material 12. Such openings may be referred to as first and second openings.

Channel material 26 is within the openings 22 and 24. Such channel material extends vertically along the memory cell levels 20 and the select device level 16, and extends downwardly into the conductively-doped semiconductor materials 12 and 15. The channel material may comprise any suitable composition or combination of compositions; and in some embodiments comprises silicon. The vertically-extending channel material may extend substantially orthogonally relative to a horizontal upper surface of substrate 8 (as shown), or may be sloped relative to such orthogonal direction depending on whether the sidewalls of opening 22 and 24 are straight or slanted. The term "substantially orthogonal" means orthogonal to within reasonable tolerances of fabrication and measurement.

Tunneling material 28, charge-storage material 30 and charge-blocking material 32 extend vertically along the channel material 26, and are between the channel material and the vertically-stacked conductive levels 20. The tunneling material, charge-storage material and charge-blocking material may comprise any suitable compositions or combinations of compositions. In some embodiments the tunneling material 28 may comprise, for example, one or more of silicon dioxide, aluminum oxide, hafnium oxide, zirconium oxide, etc. In some embodiments the charge-storage material 30 may comprise charge-trapping materials, such as silicon nitride, silicon oxynitride, etc. In some embodiments the charge-blocking material 32 may comprise one or more of silicon dioxide, aluminum oxide, hafnium oxide, zirconium oxide, etc.

The tunneling material 28, charge-storage material 30 and charge-blocking material 32 are along the majority of the vertical extent of channel material 26, except for lower regions 34 of the channel material within openings 22 and 24. Such lower regions have vertical sidewalls 35 which are not covered by the tunneling material 28, charge-storage material 30 and charge-blocking material 32. Instead, the sidewalls 35 directly contact conductively-doped semiconductor material 15. The direct contact with conductively-doped semiconductor material 15 advantageously enables dopant to out-diffuse from material 15 into the lower regions of channel material 26 (as indicated by stippled regions 37). The out-diffusion may be well-controlled so that an interface 39 between a heavily-doped region of channel material 26 and a lightly-doped region overlaps the vertical face of select device level 16. The select device level 16 and channel material 26 together form select devices (e.g., SGS devices), and the configuration of interface 39 overlapping the vertical face of select device level 16 can provide desired non-leaky "OFF" characteristics and leaky GIDL characteristics for the select devices.

Although the illustrated embodiment comprises a single select device level, in other embodiments there may be two or more select device levels. For instance, one or more of the lower wordline levels 20 may be incorporated into a select device together with the select device level 16. Also, although the lowermost conductive levels are described as being the select device levels, in some architectures uppermost conductive levels may also be select device levels.

The illustrated channel material 26 is container-shaped within openings 22 and 24, and insulative material 36 fills an opening within the middle of the container-shaped channel material. The insulative material 36 may comprise any suitable composition or combination of compositions; and in some embodiments may comprise, consist essentially of, or consist of silicon dioxide. The container-shaped channel material 26 may be considered to form hollow channels within openings 22 and 24. In other embodiments, the channel material 26 may be configured as solid pillars within the openings 22 and 24 rather than as hollow channels.

The lower region 34 of the channel material 26 may be considered to be a portion of the channel material 26 which is directly against conductively-doped semiconductor material 15. In the shown embodiment of FIG. 1, such lower region 34 does not include a lowest region 38 of the channel material 26. Instead, segments of the tunneling material 28, charge-storage material 30 and charge-blocking material 32 are along the lowest region 38. In other embodiments the portion of channel material 26 directly against conductively-doped semiconductor material 15 (i.e., the so-called lower region 34) may include the lowest region, as discussed below with reference to FIG. 10.

A third opening 40 is between the first and second openings 22 and 24, and a conductive pillar 42 extends downwardly within such third opening to electrically connect with conductively-doped semiconductor material 15. In the illustrated embodiment the conductive pillar comprises a central first material 46 and an outer second material 48 along lateral edges of the first material 46. The first material 46 may comprise any suitable composition or combination of compositions; including, for example, one or more metals (for instance, copper), metal-containing compositions (for instance, metal nitrides, metal silicides, alloys of two or more metals, etc.) and/or conductively-doped semiconductor materials (for instance, conductively-doped silicon, conductively-doped germanium, etc.). The second material 48 may also comprise any suitable composition or combination of compositions; including, for example, one or more of the materials described above relative to first material 46. In some embodiments the first material 46 is a metal-containing core material, and second material 48 is conductively-doped semiconductor material along and directly against an outer lateral periphery of the core material. In some embodiments material 48 may be a same composition as material 15, and may be considered to be a region of material 15 extending vertically within opening 40.

As discussed above, conductive materials 12 and 15 may be part of a source line. In such embodiments the conductive pillar 42 may be an electrical contact to connect the source line with other circuitry (not shown).

Dielectric materials 50 and 52 are along lateral edges of the conductive pillar 42, and electrically isolate the conductive pillar from conductive levels 16 and 20. The dielectric materials 50 and 52 may comprise any suitable compositions or combinations of compositions; including, for example, silicon nitride, silicon dioxide, etc. In some embodiments material 50 may comprise undoped (or at least very lightly doped and non-conductive) silicon (or other semiconductor). Although two dielectric materials 50 and 52 are illustrated, in other embodiments the semiconductor material 50 may become doped by out-diffusion from material 48 and may thus become part of the conductive liner along the outer lateral periphery of core 46.

In some embodiments the vertically-stacked conductive levels 16 and 20 may be considered to be configured as laterally-spaced sets 54 and 56 on opposing sides of the conductive pillar 42 along the cross-section of FIG. 1. The first set 54 comprises the channel material 26 within opening 22, and the second set 56 comprises the channel material 26 within opening 24. In some embodiments the channel material within opening 22 may be referred to as first channel material, and the channel material within opening 24 may be referred to as second channel material. Also, the lower region 34 of channel material 26 associated with first set 54 may be referred to as a first lower region, and the vertical sidewall 35 of the first lower region may be referred to as a first vertical sidewall. Similarly, the lower region 34 of channel material 26 associated with second set 56 may be referred to as a second lower region, and the vertical sidewall 35 of the second lower region may be referred to as a second vertical sidewall.

The construction of FIG. 1 may be formed with any suitable processing. Example processing is described with reference to FIGS. 2-8.

Figure 2:
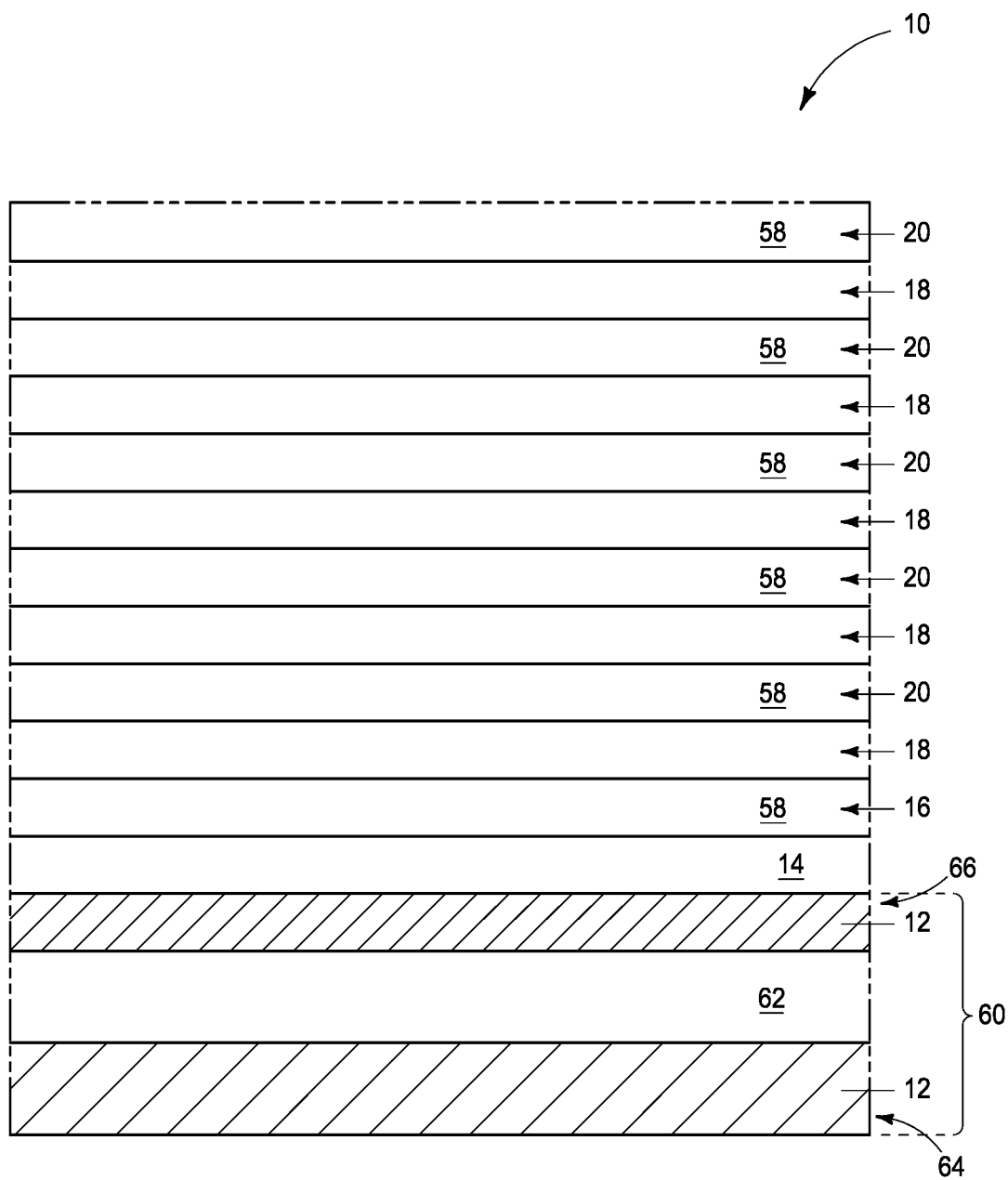
FIGS. 2-8 are process stages of an example embodiment method for fabricating the example embodiment integrated structure of FIG. 1.

Referring to FIG. 2, vertically-stacked levels 16, 18 and 20 are formed over a base 60. The levels 18 and may comprise the same dielectric material as described above with reference to FIG. 1. The select device level 16 and memory cell levels 20 may comprise conductive material at the processing stage of FIG. 2, and in some embodiments may comprise conductively-doped semiconductor material (e.g., conductively-doped silicon). However, in the illustrated embodiment the levels 16 and 20 comprise sacrificial material (which may also be referred to as replaceable material) 58. The sacrificial material 58 may comprise, for example, silicon nitride; and will be replaced with conductive material at a later processing stage.

The select device level 16 is spaced from the base 60 by insulative material 14.

The base 60 comprises conductively-doped semiconductor material 12, and comprises sacrificial material 62. In the illustrated embodiment two regions of the conductively-doped semiconductor material 12 are provided, with one of the regions being a lower region 64 and the other being an upper region 66. In other embodiments upper region 66 may be omitted. Regardless, sacrificial material 62 is formed over the lower region 64 of conductively-doped semiconductor material 12.

The substrate 8 is not shown in FIG. 2, but it is to be understood that a supporting structure like substrate 8 may be present.

Figure 3:
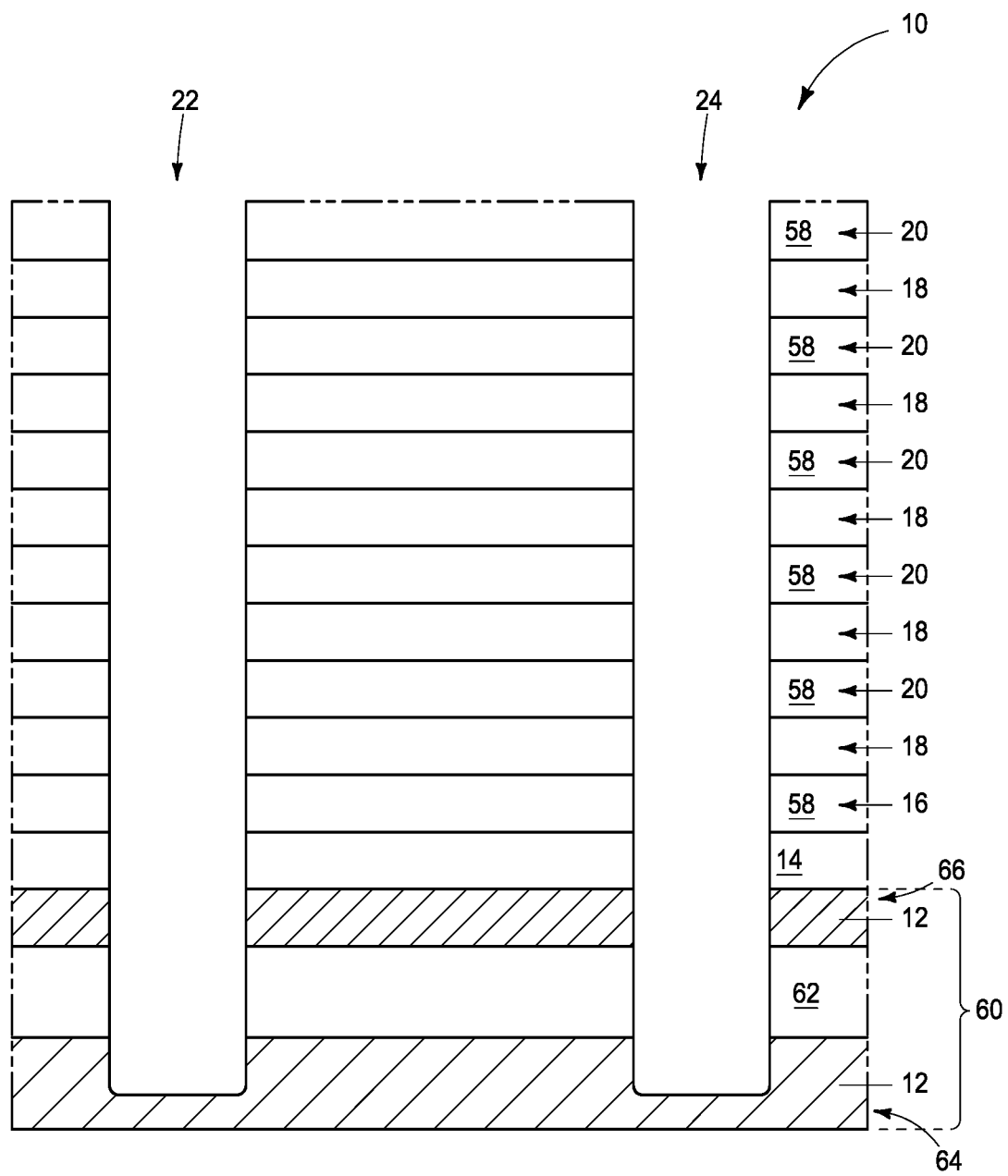

Referring to FIG. 3, the first and second openings 22 and 24 are formed to extend through the levels 16 and 20, through the sacrificial material 62, and into the lower region 64 of conductively-doped semiconductor material 12.

Figure 4:
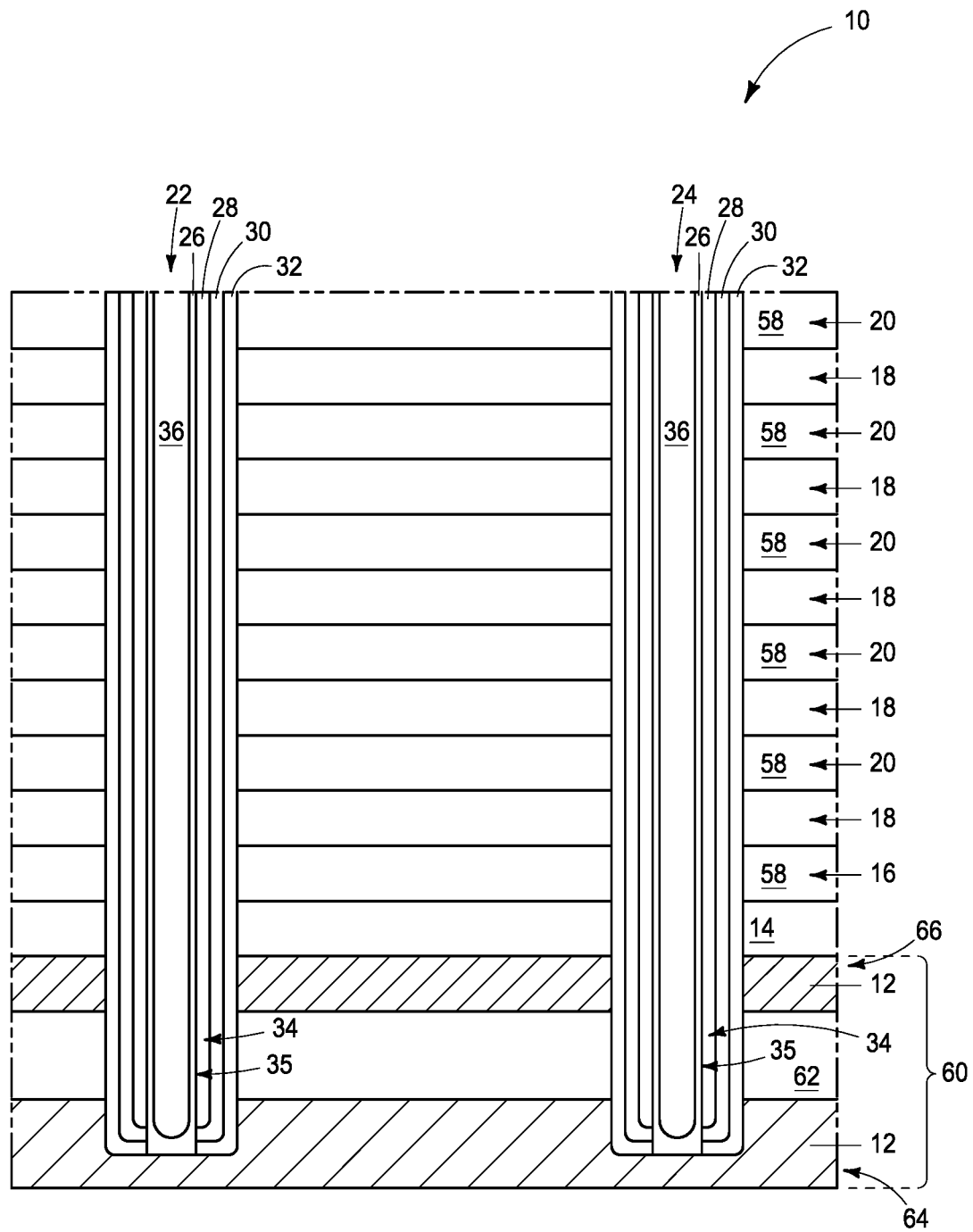

Referring to FIG. 4, charge-blocking material 32, charge-storage material 30, tunneling material 28, channel material 26 and insulative material 36 are formed within openings 22 and 24. The various materials 26, 28, 30, 32 and 36 may be formed with any suitable processing. In the illustrated embodiment materials 28, 30 and 32 are initially forming along sidewalls of openings 22 and 24 to narrow the openings, and then an etch is utilized to punch through the bottom of materials 28, 30 and 32 to expose semiconductor material 12. Subsequently, channel material 26 is formed to line the narrowed openings, with the channel material being configured in the illustrated container shape. The insulative material 36 is then formed within the container-shape defined by the channel material.

The channel material extends vertically along the memory cell levels 20, the select device level 16 and the sacrificial material 62, and extends downwardly into the lower region 64 of conductively-doped semiconductor material 12. Regions of the channel material within the sacrificial material 62 correspond to the lower regions 34 described above with reference to FIG. 1. Such lower regions have sidewalls 35.

Figure 5:
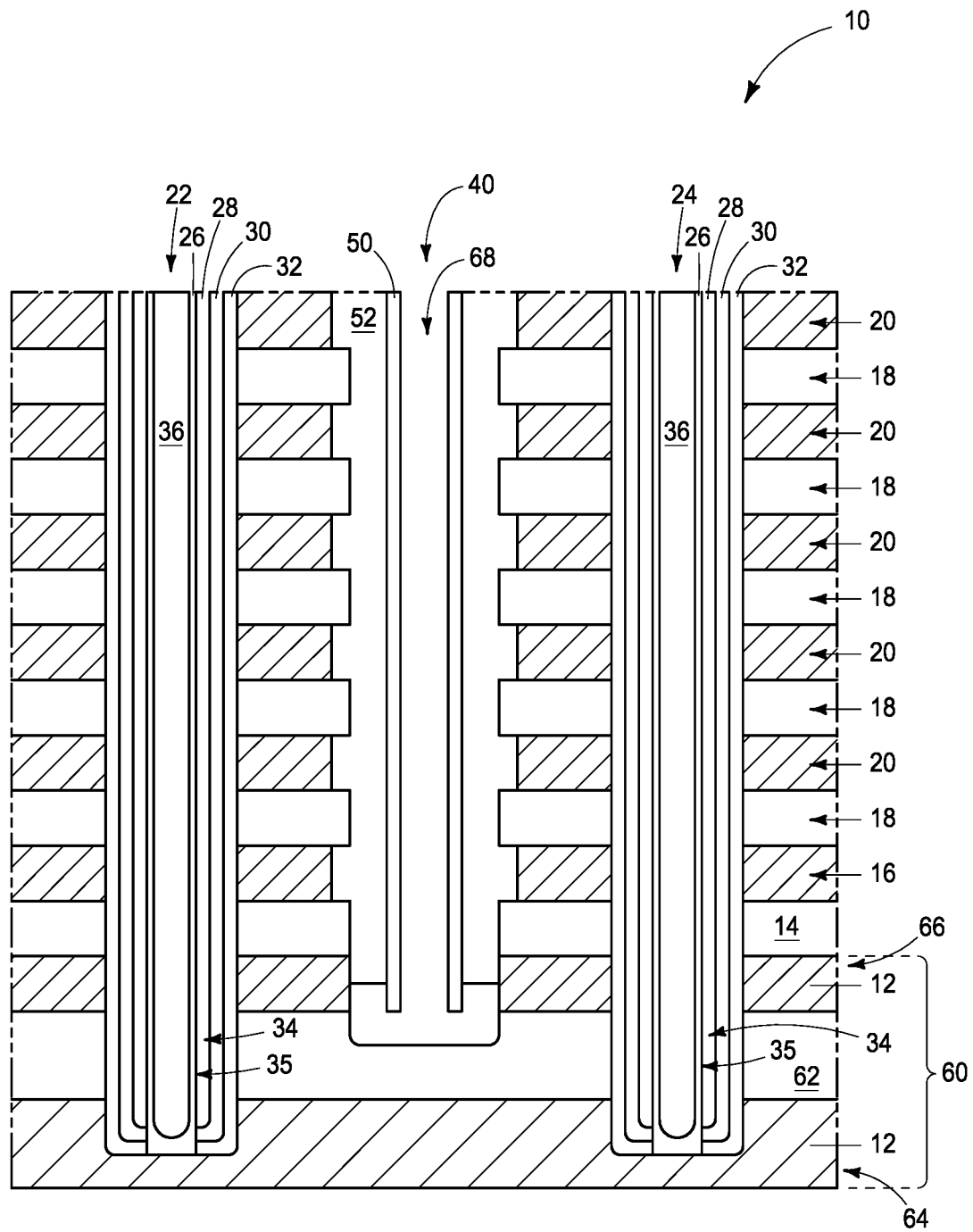

Referring to FIG. 5, the third opening 40 is formed between the first and second openings 22 and 24. The third opening extends through the vertically-stacked levels 16 and 18, and into the sacrificial material 62.

In the illustrated embodiment the sacrificial material 58 (FIG. 4) is replaced with conductive material, such as, for example, metal-containing material (for instance, tantalum, tungsten, etc.). In other embodiments conductive material may be present in place of the sacrificial material 58 at the processing stage of FIG. 2, and accordingly the replacement of sacrificial material 58 may be omitted relative to the processing stage of FIG. 5.

Insulative materials 50 and 52 are formed within opening 40, and an etch is conducted to punch through material 50 and remove the material 52 at the bottom of opening 40 so that a void 68 extends down a center of opening 40 and to the sacrificial material 62. In some embodiments material 52 comprises silicon dioxide or other suitable dielectric, and material 50 comprises undoped (or at least non-conductively-doped) silicon (or other suitable semiconductor).

Figure 6:
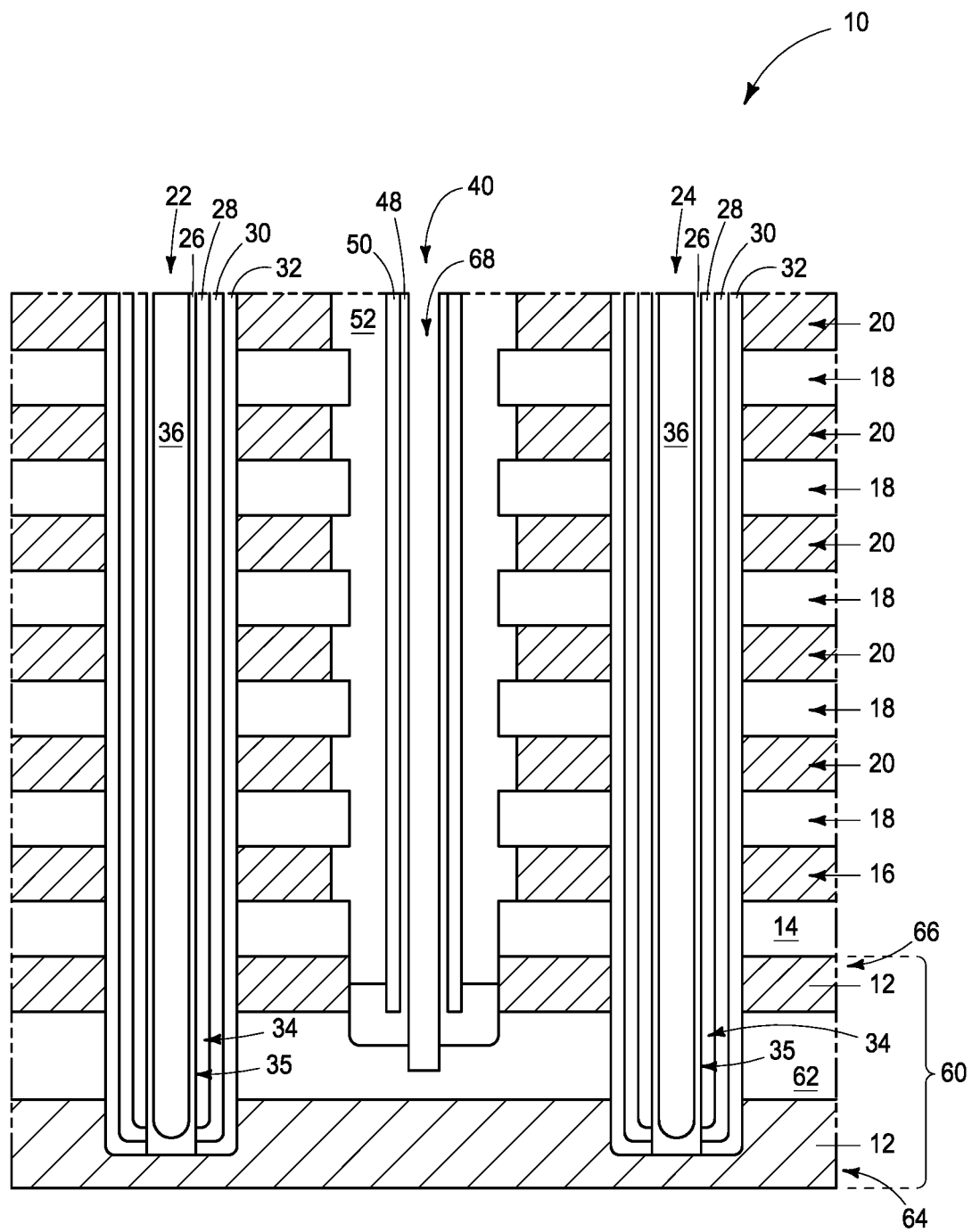

Referring to FIG. 6, a semiconductor material liner 48 is formed within opening 40 to narrow void 68. The semiconductor material 48 may be conductively-doped at the processing stage of FIG. 6, or may be doped with an implant following the processing stage of FIG. 6.

An etch is conducted to punch through the bottom of semiconductor material 48 and expose sacrificial material 62.

Figure 7:
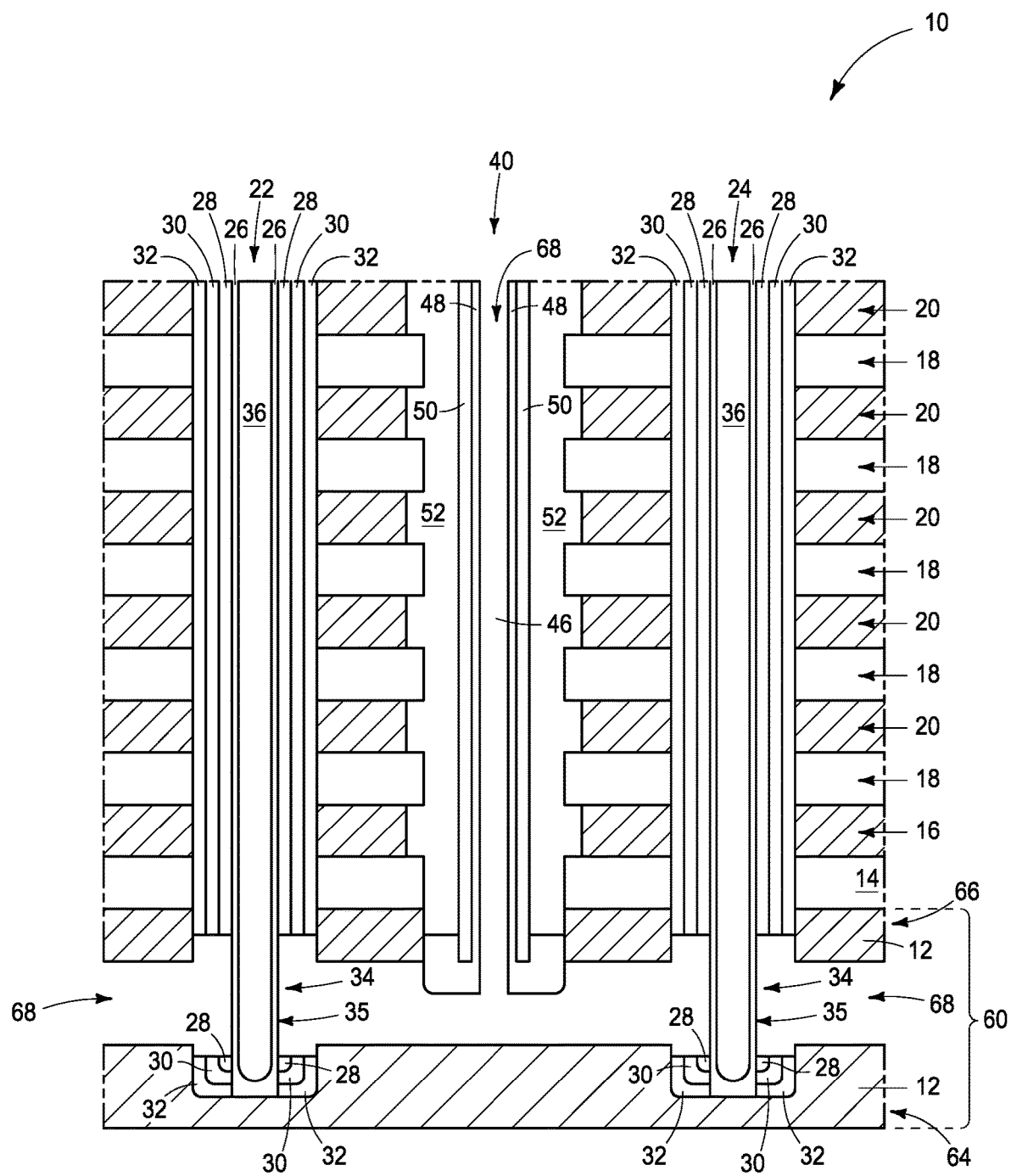

Referring to FIG. 7, etchant is provided through the void 68 of opening 40 to remove sacrificial material 62 (FIG. 6). Such extends void 68 across the region previously occupied by sacrificial material 62, and in some embodiments may be considered to form a void over the lower portion 64 of conductively-doped semiconductor material 12.

The removal of sacrificial material 68 is selective relative to semiconductor materials 48 and 12. In some embodiments semiconductor materials 48 and 12 may consist essentially of, or consist of appropriately-doped silicon; and sacrificial material 62 (FIG. 6) may comprise germanium, either alone or in combination with silicon. In such embodiments, the chemistry utilized to move the germanium-containing material relative to materials 12 and 48 may include one or more of nitric acid, hydrofluoric acid, acetic acid and hydrogen peroxide.

The same etch chemistry, or additional etch chemistry, is utilized to remove tunneling material 28, charge-storage material 30 and charge-blocking material 32 from along the lower regions 34 of channel material 26, and thereby expose vertical sidewalls 35.

Figure 8:
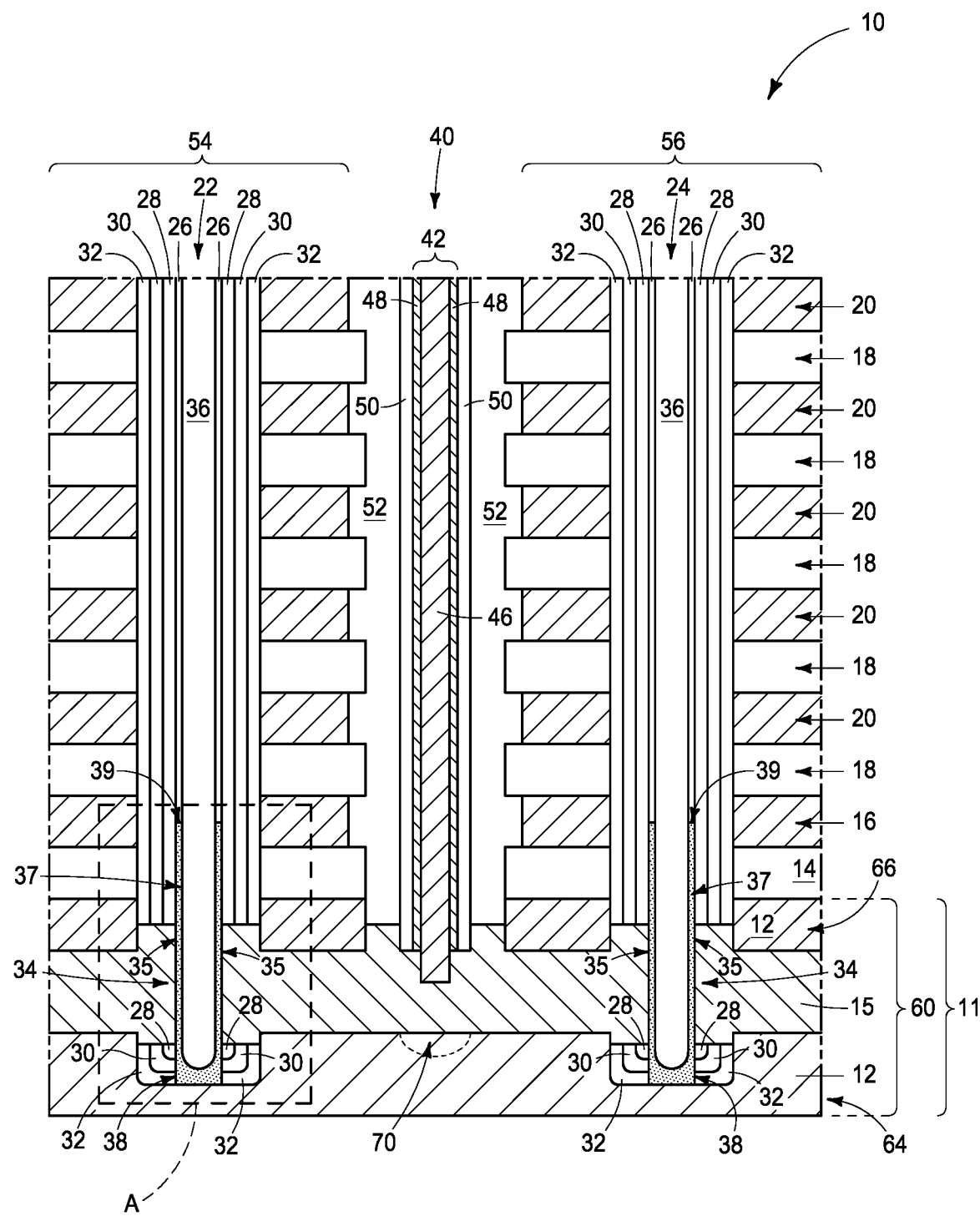

Referring to FIG. 8, the portion of void 68 (FIG. 7) within base 60 is filled with conductively-doped semiconductor material 15. The material 15 may be in-situ doped, or at least some of the material 15 may be doped with an implant.

The portion of void 68 (FIG. 7) within opening 40 is lined with conductively-doped semiconductor material 48 and then filled with core material 46. The conductively-doped semiconductor material 48 may be the same as material 15, and may be residual material remaining after formation of material 15 within base 11. In some embodiments, at least some of material 48 may be a conductively-doped region of semiconductor material 15, and may result from an implant of dopant into the semiconductor material 15. An implant region 70 is diagrammatically illustrated within the lower region 64 of semiconductor material 12 beneath opening 40 to reflect that conductivity-enhancing dopant may be implanted through the opening 40 in some embodiments.

After conductively-doped silicon material 15 is provided adjacent the exposed sidewalls 35 of channel material 26, dopant may be out diffused from material 15 into the channel material 26 (as indicated by stippling 37) to form a desired heavily-doped portion of the channel material extending upwardly to overlap a vertical sidewall of the select gate level 16.

The conductively-doped material 15 may be identical to the material 12 in some embodiments, and in other embodiments may be compositionally different from material 12.

The construction 10 of FIG. 8 is identical to that described above with reference to FIG. 1.

Figure 9:
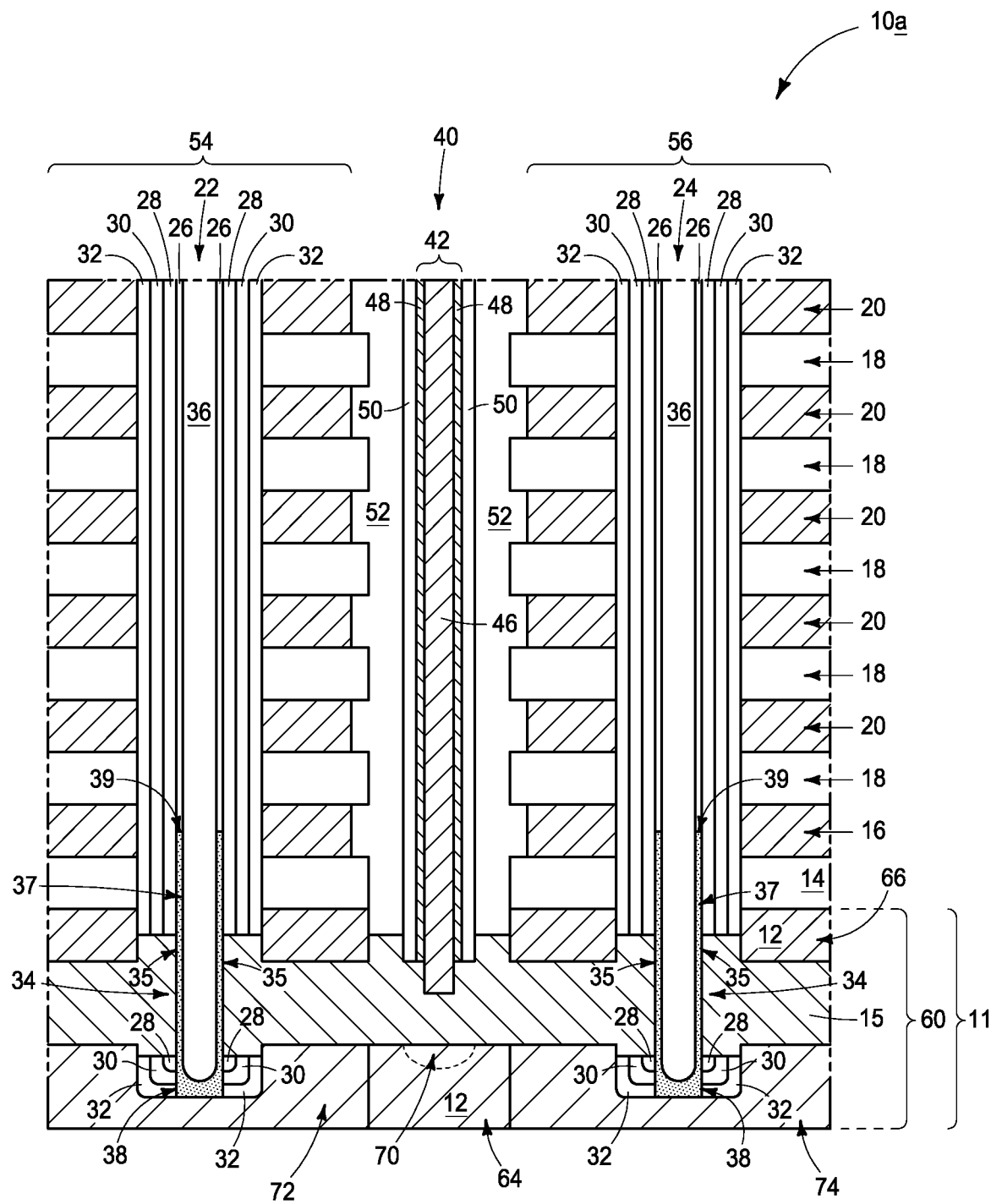
FIG. 9 is a diagrammatic cross-sectional view of another example embodiment integrated structure.

The embodiment of FIGS. 1 and 8 is one of many embodiments that may be formed utilizing the processing described herein. FIG. 9 shows a construction 10a illustrating another example embodiment. The embodiment of FIG. 9 is similar to that of FIG. 8, except that the lower semiconductor region 12 is provided between a pair of metal-containing regions 72 and 74. The metal-containing regions may comprise any suitable composition or combination of compositions; and in some embodiments may comprise one or more of tungsten, titanium, titanium nitride, tungsten nitride, etc. The metal-containing regions 72 and 74 are directly under the conductively-doped silicon material 15 and under the channel material 26, and both of the semiconductor material 15 and the channel material 26 directly contact the metal-containing regions 72 and 74. In some embodiments the metal-containing region 72 under first set 54 may be considered to be a first metal-containing region, and the metal-containing region 74 under the second set 56 may be considered to be a second metal-containing region. The lower semiconductor region 64 is laterally between the first and second metal-containing regions 72 and 74, and directly under the conductive pillar 42.

Figure 10:
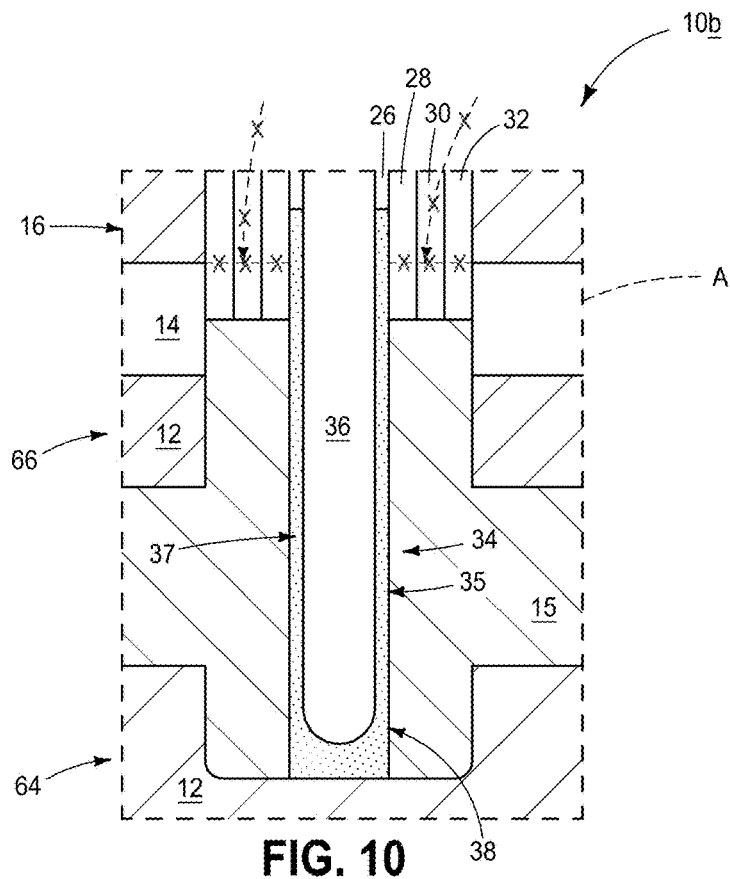
FIGS. 10 and 11 are views of a region "A" of FIG. 8 showing alternative example embodiment structures relative to the structure of FIG. 8.
Figure 11:
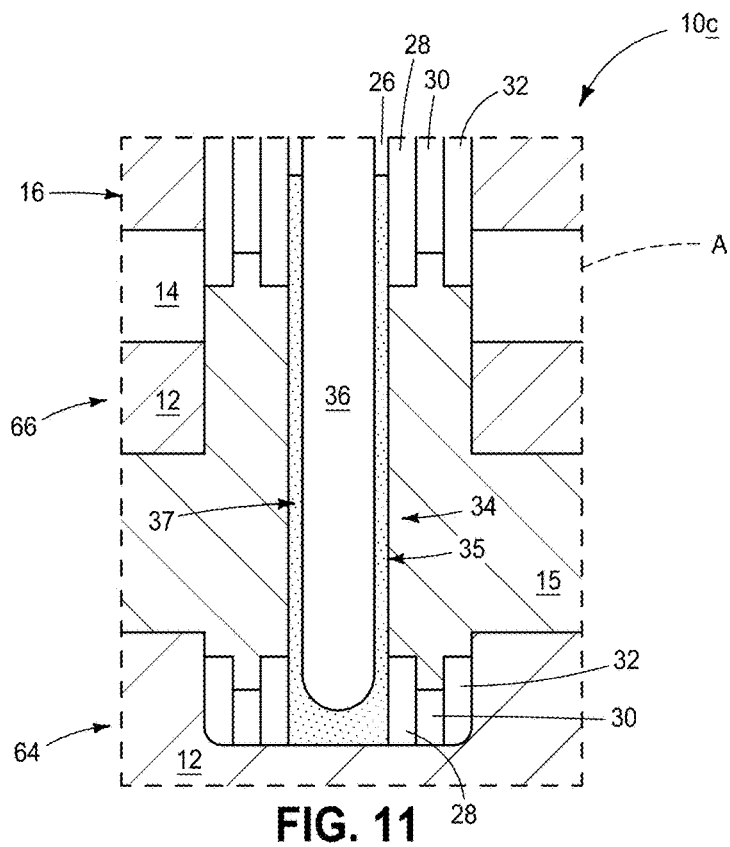

FIGS. 10 and 11 show a region "A" of FIG. 8 and illustrate alternative constructions 10b and 10c, respectively.

Referring to FIG. 10, the tunneling material 28, charge-storage material 30 and charge-blocking material 32 have been removed from along the bottom of the channel material 26 during the etching of FIG. 7. Accordingly, the lower region 34 of the channel material (defined as a region of the channel material which is directly against conductively-doped semiconductor material 15) includes the lowest region 38 of the channel material, in contrast to the embodiment of FIG. 8 in which the lower region of the channel material did not include the lowest region of such channel material.

Referring to FIG. 11, an embodiment is illustrated in which the charge-trapping material 30 etches at a different rate relative to materials 28 and 32. In the illustrated embodiment the charge-trapping material is etched more than the materials 28 and 32, and accordingly is recessed relative to materials 28 and 32. In other embodiments the charge-trapping material may be less etched than the materials 28 and 32. In yet other embodiments materials 28 and 32 may be etched differently than one another, rather than being etched to be approximately even with one another.

The integrated structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure comprising vertically-stacked conductive levels. Upper conductive levels are memory cell levels, and a lower conductive level is a select device level. Conductively-doped semiconductor material is under the select device level, and is spaced from the select device level by an insulative region. Channel material extends vertically along the memory cell levels and the select device level, and extends downwardly into the conductively-doped semiconductor material. A region of the channel material that extends into the conductively-doped semiconductor material is a lower region of the channel material and has a vertical sidewall. Tunneling material, charge-storage material and charge-blocking material extend vertically along the channel material and are between the channel material and the vertically-stacked conductive levels. The tunneling material, charge-storage material and charge-blocking material are not along at least a portion of the vertical sidewall of said lower region of the channel material. The conductively-doped semiconductor material is directly against said portion of the vertical sidewall of the lower region of the channel material.

Some embodiments include an integrated structure comprising vertically-stacked conductive levels. Upper conductive levels are memory cell levels, and a lower conductive level is a select device level. The vertically-stacked conductive levels are configured as two laterally spaced sets along a cross-section, with the sets being a first set and a second set. A conductive pillar is between the first and second sets. Conductively-doped semiconductor material is under the select device levels of the first and second sets. The conductive pillar extends to the conductively-doped semiconductor material and is in electrical contact with the conductively-doped semiconductor material. First channel material extends vertically along the memory cell levels and the select device level of the first set, and extends downwardly into the conductively-doped semiconductor material. A region of the first channel material that extends into the conductively-doped semiconductor material is a first lower region of the first channel material and has a first vertical sidewall. Second channel material extends vertically along the memory cell levels and the select device level of the second set, and extends downwardly into the conductively-doped semiconductor material. A region of the second channel material that extends into the conductively-doped semiconductor material is a second lower region of the second channel material and has a second vertical sidewall. The conductively-doped semiconductor material is directly against the first and second vertical sidewalls.

Some embodiments include a method of forming an integrated structure. Vertically-stacked levels are formed over a base. The base comprises a sacrificial material over a first conductively-doped semiconductor material. Upper levels are memory cell levels, and a lower level is a select device level. Openings extend through the levels, through the sacrificial material, and into the conductively-doped semiconductor material. The openings are a first opening and a second opening. Tunneling material, charge-storage material and charge-blocking material are formed to extend vertically along sidewalls of the first and second openings to narrow the first and second openings. Channel material is formed within the narrowed first and second openings. The channel material extends vertically along the memory cell levels, the select device level and the sacrificial material, and extends downwardly into the conductively-doped semiconductor material. A region of the channel material along the sacrificial material within the narrowed first opening is a first lower region, and a region of the channel material along the sacrificial material within the narrowed second opening is a second lower region. The first and second lower regions have first and second sidewalls, respectively. A third opening is formed between the first and second openings. The third opening extends through the vertically-stacked levels and into the sacrificial material. Etchant is provided within the third opening to remove the sacrificial material, and to remove lower regions of the tunneling material, charge-storage material, and charge-blocking material to expose the first and second sidewalls, and to form a void over the first conductively-doped semiconductor material. A second conductively-doped semiconductor material is formed within the void and directly against the exposed first and second sidewalls of the channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated structure, comprising:
    forming vertically-stacked levels over a base; the base comprising a sacrificial material over and in direct physical contact with a first conductively-doped semiconductor material; upper levels of the vertically-stacked levels being memory cell levels, and a lower level of the vertically-stacked levels being a select device level;
    forming a pair of openings extending through the memory cell levels, through the select device level, through the sacrificial material, and into the first conductively-doped semiconductor material; the openings being a first opening and a second opening;
    forming a tunneling material, a charge-storage material and a charge-blocking material extending vertically along sidewalls of the first and second openings to narrow the first and second openings; the charge-storage material comprising silicon and nitrogen;
    forming a channel material within the narrowed first and second openings; the channel material extending vertically along the memory cell levels, the select device level and the sacrificial material, and extending downwardly into the first conductively-doped semiconductor material, a bottom surface of the channel material being in direct physical contact with the first conductively-doped semiconductor material; a region of the channel material along the sacrificial material within the narrowed first opening being comprised by a first lower region, and a region of the channel material along the sacrificial material within the narrowed second opening being comprised by a second lower region; the first and second lower regions of the channel material having first and second sidewalls, respectively; the first and second lower regions of the channel material having first segments along the sacrificial material, and having lowest segments beneath the first segments and along the first conductively-doped semiconductor material;
    removing regions of the tunneling material, the charge-storage material, and the charge-blocking material along the first segments of the channel material to expose the first and second sidewalls along said first segments, and to form a void over the first conductively-doped semiconductor material; regions of the tunneling material, the charge-storage material, and the charge-blocking material along the lowest segments not being removed and remaining along the first conductively-doped semiconductor material; and
    forming a second conductively-doped semiconductor material within the void and directly against the exposed first and second sidewalls of the channel material; the second conductively-doped semiconductor material being over the regions of the tunneling material, the charge-storage material, and the charge-blocking material remaining along the first conductively-doped semiconductor material.

2. The method of claim 1 wherein the first and second conductively-doped semiconductor materials are a same composition as one another.

3. The method of claim 1 wherein the first and second conductively-doped semiconductor materials are different compositions relative to one another.

4. The method of claim 1 wherein the sacrificial material comprises germanium; and wherein the first conductively-doped semiconductor material consists of conductively-doped silicon.

5. The method of claim 1 wherein the sacrificial material comprises silicon and germanium; and wherein the first conductively-doped semiconductor material consists of conductively-doped silicon.

6. A method of forming an integrated structure, comprising:
    forming vertically-stacked conductive levels; upper conductive levels of the vertically-stacked conductive levels being memory cell levels, and a lower conductive level of the vertically-stacked conductive levels being a select device level;
    forming a conductively-doped semiconductor material under the select device level, and spaced from the select device level by an insulative region;
    forming a channel material extending vertically along the memory cell levels and the select device level, and extending downwardly into the conductively-doped semiconductor material, an elevationally bottommost surface of the channel material being in direct contact with the conductively-doped semiconductor material; a region of the channel material that extends into the conductively-doped semiconductor material being a lower region of the channel material and having a vertical sidewall;
    forming a charge-storage material extending vertically along the channel material and being between the channel material and the vertically-stacked conductive levels; the charge-storage material not being along at least a portion of the vertical sidewall of said lower region of the channel material; the conductively-doped semiconductor material being directly against said portion of the vertical sidewall of the lower region of the channel material; and
    wherein said portion of the vertical sidewall of the lower region of the channel material is formed above a lowest region of the channel material; and wherein the charge-storage material is formed along the lowest region of the channel material.

7. A method of forming an integrated structure, comprising:
    forming vertically-stacked conductive levels; upper conductive levels of the vertically-stacked conductive levels being memory cell levels, and a lower conductive level of the vertically-stacked conductive levels being a select device level;

forming a source-structure-material under the select device level, and spaced from the select device level by an insulative region;

forming a channel material extending vertically along the memory cell levels and the select device level, and extending downwardly into the source-structure-material; a region of the channel material that extends into the source-structure-material being a lower region of the channel material and having a vertical sidewall, the channel material having an elevationally bottommost surface in direct contact with the source-structure material;

forming a charge-storage material extending vertically along the channel material and being between the channel material and the vertically-stacked conductive levels; the charge-storage material not being along a portion of the vertical sidewall of said lower region of the channel material;

wherein said portion of the vertical sidewall of the lower region of the channel material is formed above a lowest region of the channel material; and wherein the charge-storage material is formed along the lowest region of the channel material; and forming a doped region of the channel material extending along said portion of the vertical sidewall of the lower region of the channel material, the doped region only partially vertically overlapping the select device level.

8. The method of claim 7 further comprising forming a metal-containing material under the source-structure-material and in direct contact with the source-structure-material.

9. The method of claim 7 wherein the source-structure-material comprises silicon.

10. The integrated structure of claim 7 wherein the source-structure-material comprises germanium.

11. A method of forming an integrated structure, comprising:

forming memory cell levels over a select device level;

forming a source-structure-material under the select device level;

forming a channel material extending through the memory cell levels and the select device level, and extending downwardly into the source-structure-material; a region of the channel material that extends into the source-structure-material being a lower region of the channel material;

forming a charge-storage material extending along the channel material and being between the channel material and the memory cell levels; the charge-storage material not being along a segment of said lower region of the channel material;

wherein said segment of the lower region of the channel material is formed above a lowest portion of the channel material; and wherein the charge-storage material is formed along vertical sidewalls of the lowest portion, a bottom surface of the lowest portion of the channel material being directly against the source-structure-material; and forming a doped region of the channel material extending along said segment of the lower region of the channel material, the doped region only partially vertically overlapping the select device level.

12. The method of claim 11 further comprising forming a metal-containing material under the source-structure-material and in direct contact with the source-structure-material.

13. The method of claim 12 wherein the lowest portion of the channel material extends into the metal-containing material.

14. The method of claim 11 wherein the lowest portion of the channel material is within the source-structure-material.

15. A method of forming an integrated structure, comprising:

providing a base;

forming a first material over the base, the first material being conductively doped semiconductor material;

forming a sacrificial material over and in direct physical contact with the first material;

forming a stack over the sacrificial material, the stack comprising a dielectric material vertically alternating with a conductive material;

forming an opening extending through the stack, through the sacrificial material and into the first material;

forming a channel material within the opening, a bottom surface of the channel material being in direct physical contact with the first conductively-doped semiconductor material; and replacing the sacrificial material with a semiconductor material, wherein the semiconductor material is formed to be in direct physical contact with the channel material.

16. The method of claim 15 further comprising, after forming the opening, lining the opening with a tunneling material, a charge-storage material and a charge-blocking material.

17. The method of claim 16 wherein the replacing the sacrificial material comprises:

performing a selective etch of the sacrificial material to selectively remove the sacrificial material relative to the first material and the channel material, the selective etch producing a void area;

etching through the tunneling material, through the charge-storage material and through the charge-blocking material to expose a portion of the channel material; and filling the void area with the semiconductor material.

* * * * *